(12) United States Patent
Chuang et al.

(10) Patent No.: US 12,016,110 B2
(45) Date of Patent: Jun. 18, 2024

(54) ELECTRONIC DEVICE WITH ACTIVE HEAT TRANSFER

(71) Applicant: Microsoft Technology Licensing, LLC, Redmond, WA (US)

(72) Inventors: Kang-Ming Chuang, Taipei (TW); Yi-Ming Kao, New Taipei (TW)

(73) Assignee: Microsoft Technology Licensing, LLC, Redmond, WA (US)

( * ) Notice: Subject to any disclaimer, the term of this patent is extended or adjusted under 35 U.S.C. 154(b) by 140 days.

(21) Appl. No.: 17/588,817

(22) Filed: Jan. 31, 2022

(65) Prior Publication Data

US 2023/0247755 A1 Aug. 3, 2023

(51) Int. Cl.
*H05K 1/02* (2006.01)
*H05K 7/20* (2006.01)

(52) U.S. Cl.
CPC ....... *H05K 1/0204* (2013.01); *H05K 7/20336* (2013.01); *H05K 7/2039* (2013.01)

(58) Field of Classification Search
CPC ......... H01L 23/427; H01L 23/38; G06F 1/20; G06F 2200/201; F28D 15/0275; F28D 15/0266; H05K 1/0203; H05K 7/2039; H05K 7/20418; H05K 7/20445; H05K 2201/066; H05K 2201/10545; H05K 7/20154; H05K 7/20263; H05K 7/20336; H05K 7/20409; H05K 1/0204
See application file for complete search history.

(56) References Cited

U.S. PATENT DOCUMENTS

| 5,742,478 | A | * | 4/1998 | Wu | H05K 7/20445 361/728 |
| 6,137,682 | A | * | 10/2000 | Ishimine | F28D 15/0275 257/713 |
| 6,234,240 | B1 | | 5/2001 | Cheon | |
| 6,394,175 | B1 | * | 5/2002 | Chen | H01L 23/427 257/722 |

(Continued)

FOREIGN PATENT DOCUMENTS

WO  2010143896 A2  12/2010
WO  2010148032 A2  12/2010

OTHER PUBLICATIONS

"International Search Report and Written Opinion Issued in PCT Application No. PCT/US22/048312", dated Feb. 9, 2023, 13 Pages.

(Continued)

*Primary Examiner* — Michael A Matey
(74) *Attorney, Agent, or Firm* — Holzer Patel Drennan

(57) ABSTRACT

An electronic device is provided that includes a PCB and a cooling system adapted to pull heat away from a first side of the PCB and dissipate the heat through a back surface of the electronic device. The cooling system includes a heat pipe that wraps around PCB. The cooling system further includes an active heat transfer device positioned adjacent to a second portion of the heat pipe, the active heat transfer device being adapted to absorb heat through a first surface and release the heat through a second surface of the active heat transfer device. The cooling system further includes a first passive heat transfer element that forms the back surface of the electronic device and that conducts the heat received from the active heat transfer device out of the electronic device.

20 Claims, 7 Drawing Sheets

(56) References Cited

U.S. PATENT DOCUMENTS

| | | | |
|---|---|---|---|
| 6,525,934 B1* | 2/2003 | Nakanishi | H01L 23/38 |
| | | | 174/16.3 |
| 6,650,536 B2 | 11/2003 | Lee et al. | |
| 6,708,754 B2* | 3/2004 | Wei | F28D 15/04 |
| | | | 361/679.52 |
| 7,019,974 B2* | 3/2006 | Lee | G06F 1/20 |
| | | | 174/15.2 |
| 7,209,356 B2* | 4/2007 | Lee | H01L 23/467 |
| | | | 361/679.48 |
| 7,325,406 B2 | 2/2008 | Lee et al. | |
| 7,423,876 B2 | 9/2008 | Artman et al. | |
| 7,436,059 B1 | 10/2008 | Ouyang | |
| 10,694,644 B2 | 6/2020 | Campbell et al. | |
| 11,665,856 B2* | 5/2023 | Thompson | H05K 7/20509 |
| | | | 361/688 |
| 2003/0110779 A1* | 6/2003 | Otey | F25B 21/02 |
| | | | 62/3.2 |
| 2003/0189815 A1* | 10/2003 | Lee | H01L 23/427 |
| | | | 361/679.52 |
| 2004/0100769 A1* | 5/2004 | Chung | H05K 7/20154 |
| | | | 257/E23.099 |
| 2005/0030719 A1* | 2/2005 | Lin | H05K 7/20445 |
| | | | 361/719 |
| 2005/0286229 A1* | 12/2005 | Ku | H01L 23/427 |
| | | | 361/709 |
| 2008/0007914 A1* | 1/2008 | Peng | G06F 1/20 |
| | | | 257/E23.099 |
| 2008/0037222 A1* | 2/2008 | Jha | H05K 7/20445 |
| | | | 361/709 |
| 2009/0129020 A1* | 5/2009 | Fujiwara | G06F 1/203 |
| | | | 361/697 |
| 2012/0063092 A1* | 3/2012 | Lee | H01L 23/427 |
| | | | 165/104.26 |
| 2015/0342023 A1* | 11/2015 | Refai-Ahmed | H05K 1/0203 |
| | | | 29/829 |
| 2020/0294884 A1* | 9/2020 | Shaikh | H01L 23/38 |
| 2021/0181819 A1* | 6/2021 | Scobee | H01L 23/38 |
| 2021/0278887 A1* | 9/2021 | Lee | G06F 1/28 |

OTHER PUBLICATIONS

"Wireless Charging Phone Cooler Pro for Gaming Phone-Smartphone Cooler Radiator for 4.4-7 inches IOS / Android Semiconductor Radiator-Fast Cooling in 1 Second—Phone Cooler for Gaming (With QC3.0 Adapter)", Retrieved From: https://www.amazon.com/Wireless-Charging-Phone-Smartphone-Semiconductor-Radiator-Fast/dp/B095RZGVKC/ref=sr_1_1_sspa?, May 25, 2021, 6 Pages.

Saengchandr, et al., "A Novel Approach for Cooling Electronics Using a Combined Heat Pipe and Thermoelectric Module", In American Journal of Engineering and Applied Sciences, vol. 2, Issue 4, 2009, pp. 603-610.

* cited by examiner

ELECTRONIC DEVICE WITH ACTIVE HEAT TRANSFER

BACKGROUND

Electronic devices consume electrical energy and generate heat. Sufficient heat can be generated such that a user can be harmed by touching a surface of an electronic device. Further, higher temperatures can impact performance of the computing device. Cooling systems for electronic devices can be deployed to mitigate negative effects of heat generated by the electronic devices.

SUMMARY

The described technology provides an electronic device that includes a PCB and a cooling system adapted to pull heat away from a first side of the PCB and dissipate the heat through a back surface of the electronic device. The cooling system includes a heat pipe that wraps around PCB. The cooling system further includes an active heat transfer device positioned adjacent to a second portion of the heat pipe, the active heat transfer device being adapted to absorb heat through a first surface and release the heat through a second surface of the active heat transfer device. The cooling system further includes a first passive heat transfer element that forms the back surface of the electronic device and that conducts the heat received from the active heat transfer device out of the electronic device.

This summary is provided to introduce a selection of concepts in a simplified form that is further described below in the Detailed Description. This summary is not intended to identify key features or essential features of the claimed subject matter, nor is it intended to be used to limit the scope of the claimed subject matter.

Other implementations are also described and recited herein.

BRIEF DESCRIPTIONS OF THE DRAWINGS

DETAILED DESCRIPTIONS

Figure 1:
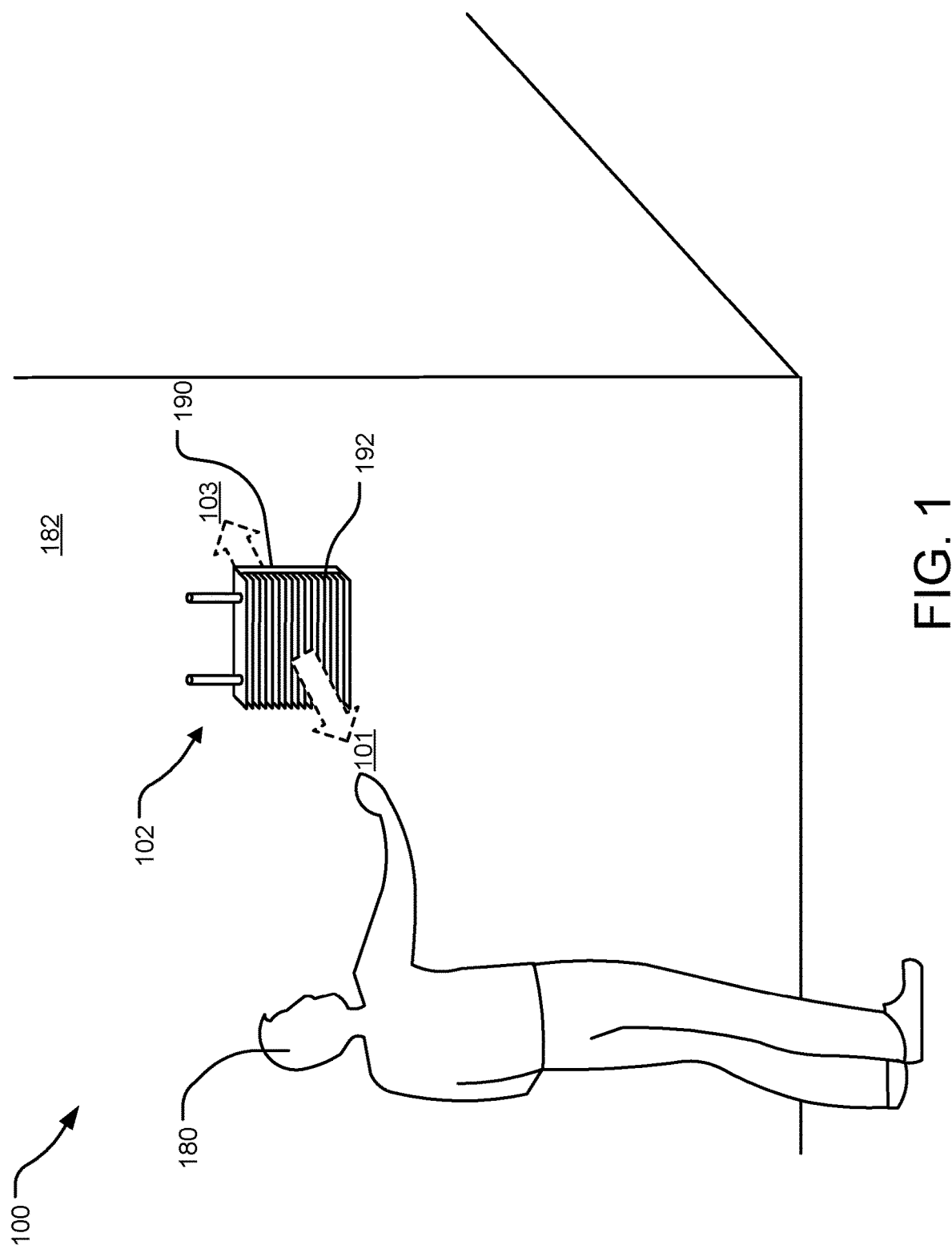
FIG. 1 illustrates an example electronic device system mounted on a wall.

Heat generated by electronic devices can cause a variety of safety, performance, and reliability issues. For example, the generated heat can cause the surfaces of the electronic devices to reach temperatures that are harmful or painful to users who interact with those surfaces. These temperatures may exceed safety limits. In order to reduce the surface temperature and/or risk to electronic components, electronic devices may throttle processes of the electronic device to reduce the heat generated by the components of the electronic devices. This may be especially true for processor systems that, when executing computationally taxing processes, can generate more heat than a cooling system of an electronic device can effectively and safely remove. The throttling of processes can directly affect the performance of the electronic device. Additionally, the performance of electronic devices is negatively affected by higher temperatures. Electronic device cooling systems may dissipate heat at only select positions on an electronic device. For example, some electronic devices may dissipate heat from a single surface of an electronic device, and the surface may be one to which users are exposed during operation.

The presently disclosed technology provides a cooling system for an electronic device that dissipates some heat from the computing device at a side of a heat source other than the side on which the heat source introduces the heat to the cooling system. In an implementation, the cooling system receives heat from a first heat generating side of a heat source and transfers the heat to a different or substantially opposite side of the heat source. The heat is transferred from the first side to the second opposite side using a heat transfer channel such as a heat pipe. The heat pipe receives heat from the first side of the component at a first portion of the heat pipe and transfers the heat to a second portion of the heat pipe on the opposite second side of the heat source. The second portion of the heat pipe further conducts the heat to a first surface of an active heat transfer device (e.g., a thermoelectric cooler (TEC)) that substantially faces a direction of the heat source.

The active heat transfer device may actively transfer the heat (e.g., by the Peltier effect or by convective heat exchange) from the first surface to a second opposite surface of the active heat transfer device that faces away from the heat source. For the purpose of this specification, an active heat transfer device is one that uses electrical energy to transfer heat from one element to another. The heat transferred to the second surface may be dissipated out of the electronic device via a passive heat transfer element (e.g., a heat sink) on the second opposite side of the heat-generating component. The heat may be dissipated out of a back surface of the electronic device, which is arranged on a side of the heat source other than the side from which the heat source introduces the heat to the first portion of the heat pipe.

In one implementation, a front surface of the electronic device, which is on the first side of the heat source, additionally dissipates at least some heat generated by the heat source. For example, the front surface may include a passive heat transfer element to dissipate some of the heat transferred through the front surface.

Distributing the heat to multiple surfaces or positions on the electronic device may reduce the temperature of any particular position on a surface of the electronic device. This may allow the electronic device to operate at a higher capacity because the electronic device will not become sufficiently hot at any surface position to harm a user. Also, by dissipating heat from multiple surfaces, more heat can be dispelled from the electronic system overall. Further, distributing the heat more evenly within the device may allow the components to perform better and may reduce the likelihood that any particular component overheats.

In one implementation, the electronic device is adapted to be mounted to a wall or other mounting structure. The back surface of the electronic device is at least partially covered by the mounting wall or structure. The electronic device directs a significant amount of heat to the portion of the back surface covered by the mounting wall or structure. For example, the back surface of the electronic device may include a plate, a portion of which is in thermal communication with the second surface of the active heat transfer device. This portion of the plate may be a hotspot to which most of the heat transferred from the first side of the heat source to the second opposite side of the heat source is directed. The plate may have mounting components (e.g., threaded holes) surrounding the hotspot, such that mounting the electronic device covers the hotspot on the plate. In doing so, the electronic device can reach temperatures above safety limits at the hotspot and/or other areas covered by the mounting wall or structure without concern for the safety of the user.

In another implementation, the electronic device controls electrical energy supplied to the active heat transfer device. For example, the electronic device (e.g., its processing system) may control (e.g., modify or modulate) the electrical energy supplied to the active heat transfer device to control the extent to which the active heat transfer device actively transfers heat. The modification and/or control may be based on a determination of whether the electronic device satisfies a thermal control condition.

FIG. 1 illustrates an example electronic device system 100 mounted on a wall. The electronic device system 100 includes an electronic device 102 with an active cooling system (internal to the electronic device 102 and not shown in FIG. 1). The electronic device 102 is illustrated as being mounted to a wall 182 with a user 180 attempting to touch the electronic device 102. The electronic device 102 includes interior heat sources (not illustrated) that generate heat when the electronic device 102 operates (e.g., computer components that generate heat). Heat is generated within the electronic device 102 and is expelled at different surfaces of the electronic device 102. As illustrated, heat (illustrated as an arrow 101) is expelled from a front surface 192 of the electronic device 102. Other heat (illustrated as an arrow 103) is dissipated from a back surface 190 of the electronic device 102 to the wall 182 on which the electronic device 102 is mounted.

By distributing heat generated to a back surface 190 of the electronic device 102, the electronic device 102 reduces the external temperature of any given portion of the electronic device 102, allowing the electronic device 102 to achieve higher performance while maintaining safer surface temperatures. Also, because the back surface 190 is covered by the mounting to the wall 182, more heat may be directed to the back surface 190 and a higher temperature of the back surface 190 may be safely maintained if mounting prevents interaction of the mounted surface with the user 180. Further, by better distributing the heat that is generated, more heat can be expelled overall, increasing the amount of processing power the electronic device 102 may deploy without damaging or otherwise affecting the performance of the electronic device 102.

In one implementation, a portion of the heat that would have dissipated in the direction of arrow 101 through the front surface 192 is actively transferred to a back surface 190 of the device. The electronic device 102 may include a cooling system that pulls heat away from a first side of a heat source (e.g., a printed circuit board (PCB)) and dissipates the heat through a back surface 190 of the electronic device 102 on a second opposite side of the heat source. The cooling system may include a heat transfer channel (e.g., a heat pipe) that wraps around the heat source and includes a first portion on the first side of the heat source and a second portion on the second opposite side of the PCB. The cooling system may further include an active heat transfer device positioned adjacent to the second portion of the heat pipe. The active heat transfer device may be adapted to absorb heat through a first surface facing the heat pipe and release the heat through a second opposite surface. The cooling system may still further include a first (back side) passive heat transfer element that conducts heat received from the second opposite surface of the active heat transfer device out through the back surface 190 of the electronic device 102.

Figure 2:
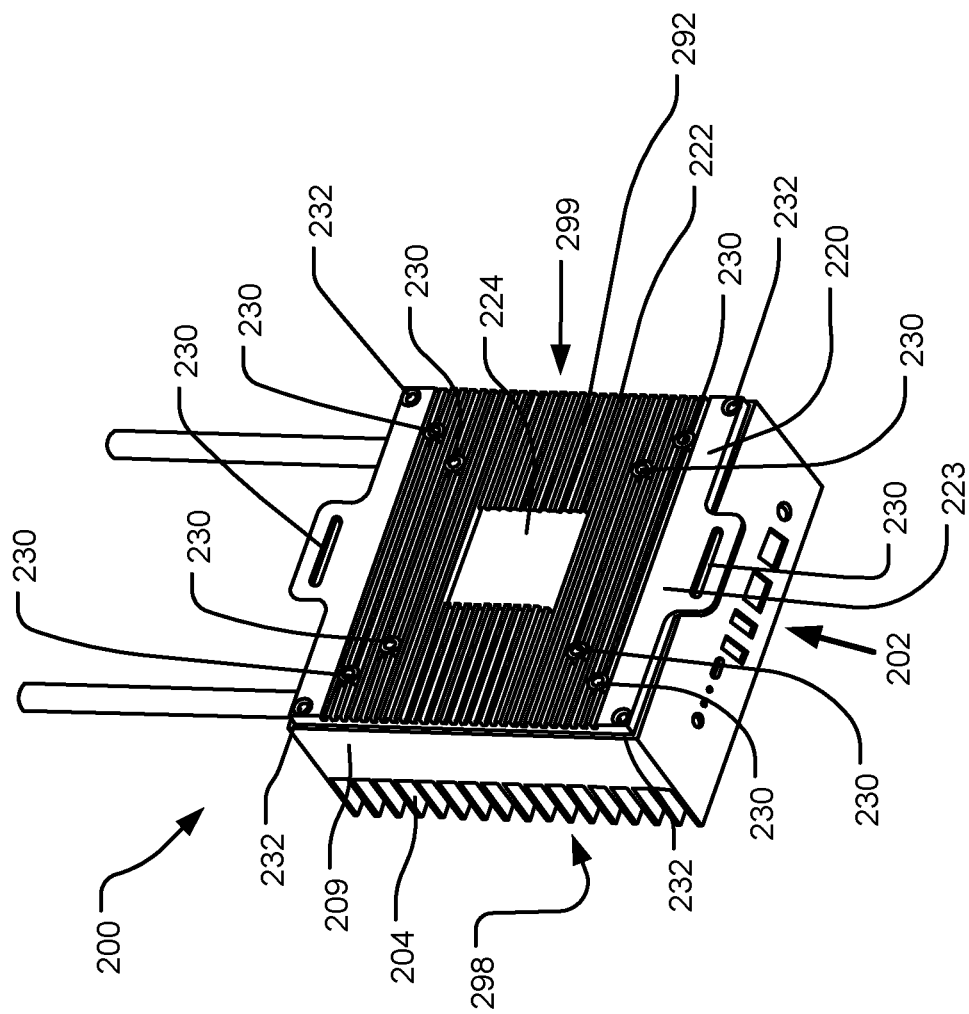
FIG. 2 illustrates a rear view of an example electronic device system.

FIG. 2 illustrates a rear view of an example electronic device system 200. The electronic device system 200 includes an electronic device 202 which may be an implementation of electronic device 102. The electronic device 202 includes a heat source (not illustrated) in its interior. The heat source may be a computing element that generates heat. The computing element may include one or more of a circuit board, a printed circuit board (PCB), a computing component (e.g., a processing system or memory), and the like. The heat source includes a first side 298 and a second side 299. The first side 298 of the heat source is a side on which the heat source generates most of its heat when the electronic device 202 operates. The second side 299 is a side other than the first side 298 on which the heat source generates less heat than the first side 298.

The electronic device 202 includes a cooling system (in the interior of the electronic device 202). The cooling system includes a heat transfer channel (e.g., a heat pipe) that wraps around the heat source and includes a first portion on the first side of the heat source (e.g., a PCB) and a second portion on the second opposite side of the heat source. The cooling system further includes an active heat transfer device positioned adjacent to the second portion of the heat pipe. The active heat transfer device may be adapted to absorb heat through a first surface facing the heat pipe and release the heat through a second opposite surface. The cooling system further includes a first (back side) passive heat transfer element 222 that conducts heat received from the second opposite surface of the active heat transfer device out through the back surface 292 of the electronic device 202.

In an implementation, the electronic device 202 includes a case 209 and a back plate 220 that may be coupled, couplable, or separably couplable to the case 209. The plate may at least partially define a back surface 292 of the electronic device 202 when the case 209 is coupled to the plate 220. The plate 220 may include or be coupled to a first passive heat transfer element 222 (e.g., a heat sink). The case 209 may include a front surface (not illustrated). The front surface may include and/or be coupled to a second passive heat transfer element 204 (e.g., a heat sink).

Some of the heat generated by the heat source is dissipated via the second passive heat transfer element 204 from the front surface on the first side 298. Other heat generated by the heat source is pulled away from and transferred around the heat source from the first side 298 to the second side 299 using a heat pipe (not shown). As shown with respect to FIG. 3, the heat pipe thermally interfaces with a first surface of an active heat transfer device arranged on the second side of the heat source, the active heat transfer device being adapted to absorb heat through the first surface facing the heat pipe. The active heat transfer device actively transfers the heat from the first surface and releases the heat through a second opposite surface that thermally interfaces with the plate 220.

For purposes of this specification, "thermally interfacing" elements refer to elements that are directly coupled, coupled by a thermal intermediary (e.g., a thermally conductive substance), and/or adjacent to one another. Thermal intermediaries such as thermal pastes may be used to increase the heat conductivity between the elements. For example, the thermal intermediaries may limit an amount of air or other low thermal conductivity substances or fluids between thermally interfacing elements (e.g., because air and other gasses tend to be poor thermal conductors).

In one implementation, the electronic device 202 includes an intermediary plate. The intermediary panel may form an interface between the second portion of the heat pipe and the first surface of the active heat transfer device. The intermediary panel may also cordon off the active heat transfer element and the plate 220 to limit heat generated by and transferred by the active heat transfer element. The air or other fluid in this cordoned-off portion may not interact with air or other fluid in a vacant space defined between the intermediary panel and the front surface.

A portion of an interior surface of the plate 220 may receive heat from the second surface of the active heat transfer device and conduct the heat to an exterior surface 223 of the plate 220 and, hence, out through the back surface of the electronic device 202. The portion of the exterior surface 223 of the plate 220 opposite the portion of the interior of the surface of the plate 220 that receives heat from the second surface of the active heat transfer device may include a hot spot 224. The hot spot 224 may be a relatively higher temperature area when the electronic device 202 operates, as heat is actively transferred to the hot spot 224 using the active heat transfer device. The first passive heat transfer element 222 may be at least partially embedded within, thermally interface with, or otherwise be coupled to the exterior surface 223 of the plate 220. The heat transferred to the hot spot 224 and/or the exterior surface 223 of the plate 220 may be conducted to the first passive heat transfer element 222 and dissipated from the first passive heat transfer element out of the back surface 292 (e.g., at the exterior surface 223 of the plate 220) of the electronic device 202.

In one implementation, the electronic device 202 is mountable at the back surface 292. For example, the plate 220 may include mounting couplers 230 to couple the plate 220 to a wall or mounting element (not illustrated), such as using one or more of threaded connectors, apertures, slots, and the like. The mounting couplers 230 may be positioned around the hot spot 224. By positioning the mounting couplers 230 around the hot spot 224, mounting the electronic device 202 using the mounting couplers 230 may cover the hot spot 224 (e.g., by a wall or a part of a mounting element). Covering the hot spot 224 and surrounding areas effectively prevents user exposure to the hottest portions of the surfaces (e.g., exterior surface 223) of the electronic device 202. This may allow the remaining exposed surfaces of the electronic device 202 to maintain operating temperatures below a safety limit or other thermal control condition.

In implementations, the plate 220 is coupled, couplable, or separably couplable with the case 209 using plate couplers 232. For example, the plate 220 may be a mounting plate for which a user may exchange a different non-mounting plate when the user desires the electronic device 202 not to be mounted. The user may decouple the plate couplers of one plate (e.g., a mounting plate) and couple a different plate (e.g., a non-mounting plate) using the plate couplers 232. If the user desires to use the electronic device 202 in a non-mounted configuration, the user may choose to exchange the plate 220 for a non-mounting plate that does not interface with an active heat transfer device to remove the hot spot 224. To reduce the likelihood of exposing the user to dangerous surface temperatures in this non-mounted configuration, it may be beneficial to operate the electronic device system 200 at lower performance levels with reduced temperatures.

Alternatively, the user may decouple the plate couplers of one plate (e.g., a non-mounting plate) and couple a different plate 220 (e.g., a mounting plate) using the plate couplers 232. As previously described, mounting the electronic device 202 may cover particularly high-temperature portions of surfaces of the electronic device 202 (e.g., the hot spot 224), allowing the electronic device 202 to operate at higher temperatures.

Figure 3:
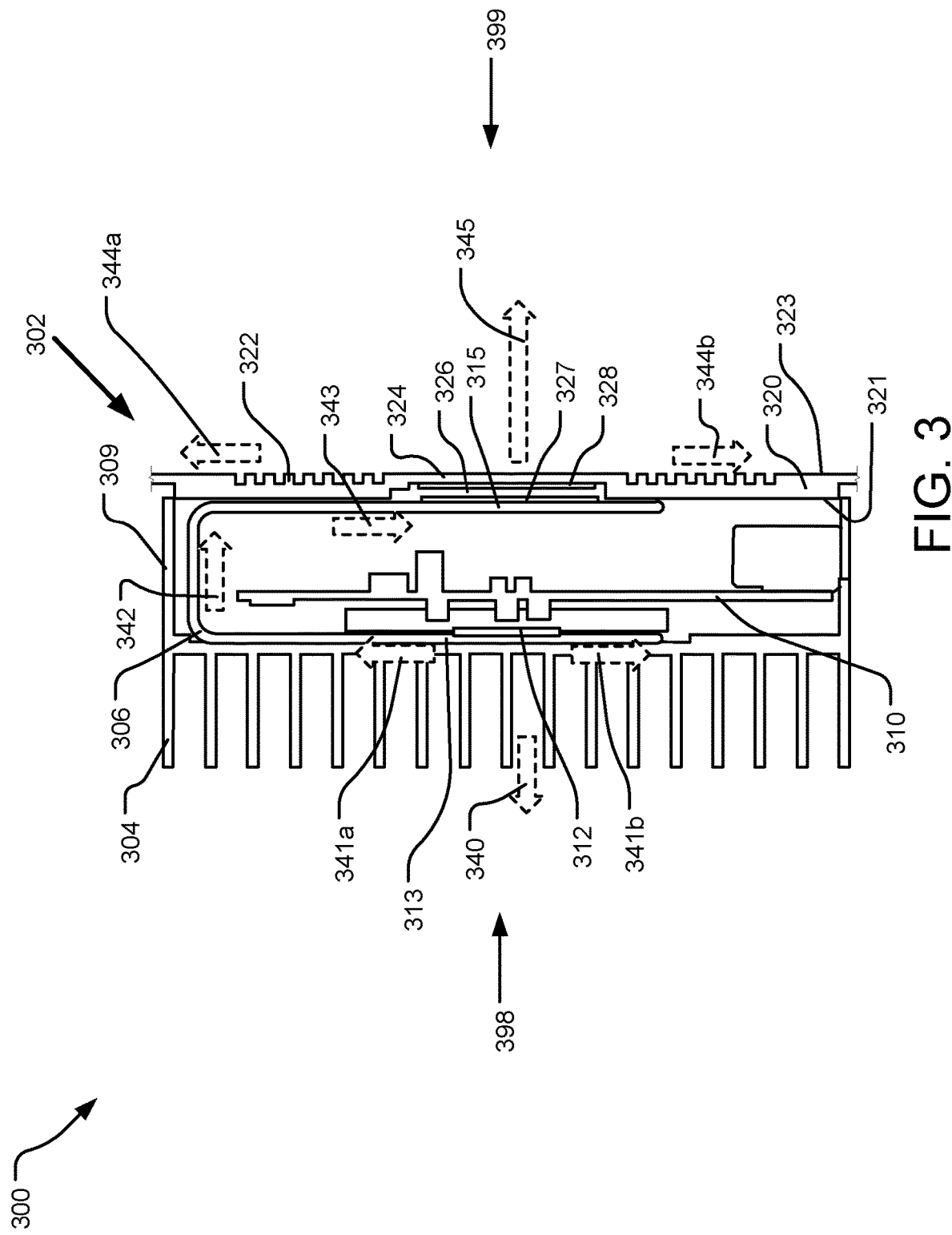
FIG. 3 illustrates a cross-sectional view of an example electronic device system.

FIG. 3 illustrates a cross-sectional view of an example electronic device system 300. The electronic device system 300 includes an electronic device 302 which may be an implementation of electronic device 102. The electronic device 302 includes a heat source 310. The heat source 310 is illustrated as a printed circuit board (PCB) that includes a processing system 312. The electronic device system 300 includes a cooling system. The cooling system may include one or more of a heat pipe 306, an active heat transfer device 326, an intermediary plate, a plate 320, and one or more passive heat transfer elements 304, 322. The cooling system may transfer heat from a first side 398 to a second side 399 of the heat source 310.

Specifically, the heat source 310 thermally interfaces with a heat pipe 306 at a first portion 313 of the heat pipe 306 positioned on the first side 398 of the heat source 310. Arrows 340-345 represent example directions of heat transfer. Heat is introduced to the heat pipe 306 from the heat source 310. Some of that heat is conducted to a front surface of the electronic device 302. The front surface may include a second passive heat transfer element 304. Heat represented by arrows 341a and 341b may transfer transversally along the front surface, and heat represented by arrow 340 may be dissipated generally in a direction orthogonal to the front surface 290 by the passive heat transfer element.

In the illustrated implementation, the heat pipe 306 wraps around the heat source 310 (e.g., around an edge of the heat source 310 or around three sides of the heat source 310) from the first side 398 to the second side 399. The heat pipe 306 receives heat at the first portion 313 from the heat source 310 on the first side 398 and transfers the heat represented by arrow 342 around the heat source 310 to a second portion 315 of the heat pipe 306. The heat pipe 306 may include a fluid on its interior that vaporizes at the first portion 313 and condenses at the second portion 315.

The volatile fluid may be selected based on predefined attributes (e.g., included in or related to a thermal control condition) to vaporize within a predefined hot temperature range and condense within a predefined cold temperature range. The hot temperature range and the cold temperature range may be based on one or more of the composition of the volatile fluid used, a predefined range of internal temperatures in the electronic device 302 (e.g., temperatures of the heat source 310) during operation, a predefined range of ambient temperatures, a predefined range of differences between the temperatures of an ambient environment and an internal temperature of the electronic device (e.g., the internal a temperature of the heat source 310), predefined temperature ranges relative to a temperature of or outside of the electronic device, and predefined vapor pressure ranges of the volatile fluid.

The second portion 315 thermally interfaces with a first ("cold") surface 327 of an active heat transfer device 326. The heat represented by arrow 343 that is transferred around the heat source 310 to the second portion 315 is conducted from the second portion 315 to the first surface 327 of the active heat transfer device 326. The active heat transfer device 326 receives electrical energy and, based on the received electrical energy, actively transfers heat from the first surface 327 to a second surface 328 of the active heat transfer device 326. The heat is conducted from the second surface 328 to an interior surface 321 of a plate 320 that, when coupled to a case 309 of the electronic device 302, defines at least a portion of a back surface of the electronic device 302.

In the illustrated implementation, the plate 320 includes a recess 325 in the interior surface 321 into which the active heat transfer device 326 is at least partially arranged when the active heat transfer device 326 is coupled to or otherwise thermally interfaces with the plate 320. The active heat transfer device 326 may include electrical contacts (e.g., electrodes) that are used to couple the active heat transfer device 326 to an electrical power source (e.g., an electrical power source of the electronic device). The recess 325 may include conformal recessed portions for the electrical contacts. The conformal recessed portions may include electrical connectors to facilitate electrical connections between the electrical contacts and an electrical power source in the electronic device 302. The recess 325 may reduce the overall thickness of the electronic device 302 and may also improve conduction of heat from the second surface 328 to the interior surface 321 of the plate 320. In implementations where the active heat transfer device 326 is a thermoelectric cooler (TEC), the second surface 328 may be a "hot surface" to which heat is actively transferred from the first surface 327 which may be a "cold surface."

The plate 320 further includes an exterior surface 323. Heat may be conducted from the interior surface 321 to the exterior surface 323. In implementations, a portion of exterior surface 323 on an opposite side of a portion of the interior surface 321 that thermally interfaces with the second surface 328 of the active heat transfer device 326 receives more heat than other portions of the exterior surface 323 of the plate 320. This portion that receives more of the heat is a hot spot 324. Covering the hot spot 324 by mounting the electronic device 302 to a wall or mounting element, allows temperatures on other surfaces of the electronic device that would otherwise be higher if the heat of the hot spot 324 was distributed. Thus, covering the hot spot 324 allows for improved safety and performance (e.g., because a safety threshold surface temperature would be exceeded at the otherwise exposed hot spot 324).

The exterior surface 323 of the plate 320 may include a first passive heat transfer element 322. As illustrated by arrows 344a, 344b, heat may transfer transversally along the exterior surface 323. Heat may be generally dissipated, as illustrated by arrow 345, in a substantially orthogonal direction relative to the exterior surface 323 to be dissipated from the first passive heat transfer element 322.

The active heat transfer device 326 is a heat transfer device that receives electrical energy to facilitate active heat exchange from the first surface 327 to a second surface 328. In the illustrated implementation, the active heat transfer device 326 is a thermoelectric cooler (TEC). The TEC is a Peltier effect heat exchanger that relies on electrical energy supplied (e.g., via a direct electrical current) to a second ("hot") surface 328 to actively transfer heat from the first surface 327 to the second surface 328. The TEC may include a first plate (e.g., one composed of ceramic material or another material that is a thermal conductor and an electrical insulator) that includes the first surface 327 and a second plate (e.g., one composed of ceramic material or another material that is a thermal conductor and an electrical insulator) that includes the second surface with p-doped and n-doped semiconductor portions between the first plate and the second plate. The p-doped and n-doped semiconductor portions are thermally connected in parallel (to allow heat to flow from the first plate to the second plate) and electrically connected in series (to allow current to pass from a source through n-doped semiconductor portions, then through a conductor that electrically couples the p-doped and n-doped semiconductor portions as a junction, then through p-doped semiconductor portions, and back to the second plate). When current is passed through the junction between the n-doped and p-doped semiconductor portions at the conductive junction, heat is actively transferred from the first plate, to the conductive junction, through the p-doped and n-doped semiconductors, and to the second plate. The Peltier cooler can also substitute p-doped and n-doped semiconductor portions with different metals or metal alloys with different properties. Alternative active heat transfer devices 326 include shell and tube heat exchangers, plate heat exchangers, plate-fin heat exchangers, finned tube heat exchangers, pillow plate heat exchangers, dynamic scraped surface heat exchangers, phase change heat exchangers, adiabatic wheel heat exchangers, direct contact heat exchangers, multi-pass heat exchangers, and condensers.

In implementations, the electrical energy supplied to the active heat transfer device is controlled by a computing system including a processing system and memory. In implementations, the extent of heat exchange by the active heat transfer device 326 can be controlled (e.g., modified) by modifying electrical energy (e.g., current and/or voltage) supplied to the active heat transfer device 326. For example, the computing system may include a thermal control module with instructions to control the active heat transfer device 326. The thermal control module may also receive temperature and/or compute resource information to monitor and dynamically modify electrical energy supplied to the active heat transfer device 326. The computing system may be an element of the heat source 310 or may be a different processing system. The computing system may modify electrical energy supplied to the active heat transfer device 326 in order to modify the extent of heat exchanged.

The computing system may modify the electrical energy supplied to the active heat transfer device 326 responsive to a determination that a thermal control condition has been satisfied. The thermal control condition may come in the form of a parameter falling within a predetermined range or satisfying a threshold. The temperature parameters may include a temperature or a difference in the temperature and another temperature. Examples of temperatures include a temperature measured within the electronic device 302, a temperature measured outside of the device (e.g., at a position on the outside of the device where little of the heat generated is expected to be transferred or from some other ambient temperature measurement source), and/or a temperature of an element of the electronic device 302 (e.g., of the heat source 310, a heat source component (e.g., processing system 312), the heat pipe 306 (and/or portions 313, 315 thereof), passive heat transfer elements 304, 322, electronic device 302 surfaces, the active heat transfer device 326 (or components thereof), and/or thermal interface intermediates). The electronic device 302 may include temperature measurement elements including a thermometer, a thermistor, or a thermocouple to provide the relevant temperature data. In an implementation, the thermal control condition includes a temperature difference between a temperature of a first position in an interior of the electronic device and a temperature of a second position outside of the electronic device exceeding a first threshold value or an operating energy that includes energy used by the PCB exceeding a second threshold value.

The thermal control condition may additionally or alternatively be based on a configuration of the electronic device 302 and/or its components. For example, configuration parameters may include specifications of passive heat transfer elements (e.g., size, surface area, width, height, depth, material, model), the processing system 312 or heat source 310 (e.g., power consumed, processing resources, size, model, max speed, number of cores), and/or the active heat transfer device 326 (e.g., input power ranges, temperature ranges, model, heat transfer capacity).

In still other implementations, the thermal control condition is alternatively or additionally based on predefined operating parameters as well. For example, the thermal control condition may be based on activation of the device, deactivation of the device, a predefined operating mode of the electronic device 302 (e.g., high-performance mode, high-efficiency mode, etc.), resources used by the electronic device 302 (e.g., electrical energy/power consumed, processing resources used, memory resources used, and networking hardware resources used), and predefined settings associated with predefined periods of time.

In still further implementations, the thermal control condition is alternatively or additionally based on a predefined expected performance of the active heat transfer device 326. For example, the thermal control condition may be at least partially based on an expected temperature difference (e.g., between example temperatures described as potential parameters) for a given utilization of energy (e.g., utilization of energy by the compute resources of the electronic device 302 and/or energy consumed by the active heat transfer device 326).

In one implementation, the active heat transfer device 326 is controlled to ensure the satisfaction of a thermal control condition that the electronic device 302 maintains a difference in temperature for a given use of electrical energy by the heat transfer device of 1.25° C. per Watt used by the electronic device 302. A scenario to demonstrate this is an electronic device 302 that consumes 20 W (e.g., including or excluding the power consumed by the active heat transfer device 326) to maintain a surface of the electronic device 302 at a temperature of 70° C. when the ambient temperature is measured to be 45° C. In this example, a temperature difference of 35° C. is maintained when the electronic device 302 uses 20 W, achieving the 1.25° C. difference per Watt used by the electronic device 302.

In implementations, heat transfer and/or heat distribution are imbalanced with respect to the first side 398 and the second side 399 of the heat source 310. For example, heat source 310 may generate more heat on the first side 398 than the second side 399. The electronic device system 300 may also transfer more of the heat generated by the heat source 310 on the first side 398 to the second side 399 than is dissipated on the first side 398 (e.g., via the first passive heat transfer element 304). The active heat transfer device 326 may cause a sufficient difference in temperature between the first surface 327 and the second surface 328 to create a larger temperature gradient between the heat source 310 and the first surface 327 than between the heat source 310 and the front surface and/or the second passive heat transfer element 304. The larger temperature gradient may facilitate the imbalance of heat transfer. The active transfer of heat on the second side 399 may also better distribute heat within the electronic device 302 by distributing more heat to the second side 399 than would have been distributed there passively without a heat pipe 306. Another potential imbalance is that one of the first passive heat transfer element 322 and the second passive heat transfer element 304 may be larger than the other.

The redistribution of heat using the active heat transfer device 326 may distribute heat more throughout the device and may distribute the heat more strategically. For example, in implementations in which the electronic device 302 is to be mounted using the plate 320, the transfer for more heat from the first side 398 to the second side 399 directs heat to an area covered by the mounting. This may allow for higher operating temperatures and performance, as the exposed surfaces (e.g., the front surface) may maintain lower temperatures during operation and not violate exposed surface temperature safety limits. Further, dissipating a greater amount of heat from more surfaces and using active heat transfer reduces the temperature of any given portion of the interior of the electronic device 302, allowing the heat source 310 and/or its components (e.g., processing system 312) to use more resources that generate more heat. Also, by having a hot spot 324 that is covered by a mounting, the tolerance for high operating temperatures of the heat source 310 may be greatly increased if most of the heat in the electronic device 302 is actively transferred to the hot spot.

Figure 4:
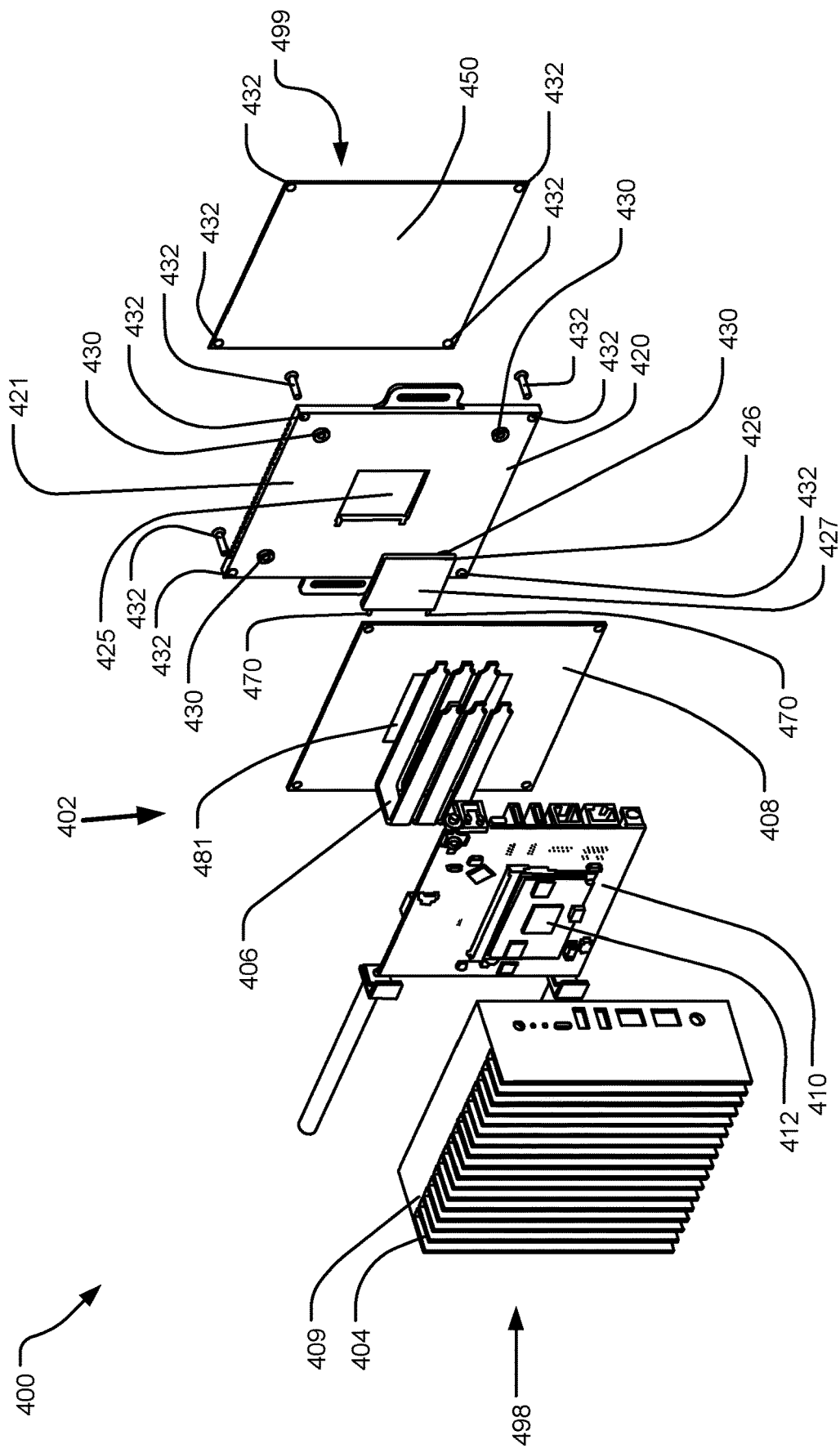
FIG. 4 illustrates an exploded view of an example electronic device system.

FIG. 4 illustrates an exploded view of an example electronic device system 400. The electronic device system 400 may include an electronic device 402 which may be an implementation of electronic device 102. The electronic device 402 may include a case 409 with a passive heat transfer element 404. A heat source 410 may be at least partially covered on its first side 498 by the case 409. As illustrated, the heat source 410 is a printed circuit board (PCB) with a processing system 412.

The electronic device 402 includes a cooling system. The cooling system includes a heat transfer channel (e.g., a heat pipe 406) that wraps around the heat source 410, such that a first portion is arranged on the first side of the heat source 410 and a second portion is arranged on the second opposite side of the heat source 410. The cooling system further includes an active heat transfer device 426 positioned adjacent to the second portion of the heat pipe 406. The active heat transfer device 426 may be adapted to absorb heat through a first surface 427 facing the heat pipe 406 and release the heat through a second opposite surface using the cooling system. The cooling system still further includes a first (back side) passive heat transfer element that conducts heat received from the second opposite surface of the active heat transfer device out through a back surface 499 of the electronic device 402.

As illustrated, the electronic device 402 includes a heat pipe 406 that substantially wraps around the heat source 410 (e.g., around an edge of the heat source 410). A first portion of the heat pipe 406 may thermally interface with the heat source 410 on the first side 498 of the heat source 410 and transfer the heat around the heat source 410 and to a second portion of the heat pipe 406. The second portion may thermally interface with a first surface 427 of an active heat transfer device 426 via a thermal interface intermediary 481 of an intermediary panel 408. Implementations are contemplated in which the intermediary panel 408 and/or the thermal interface intermediary 481 are omitted from the electronic device 402; however, the intermediary panel 408 may advantageously limit the amount of heat conducted back into the electronic device 402 from a plate 420 (e.g., by including air or another thermal insulator between the plate 420 and the intermediary panel 408), and the thermal interface intermediary 481 may advantageously improve the thermal interface between the second portion of the heat pipe 406 and the first surface 427 of the active heat transfer device 426 (e.g., by improving the conductive properties of the interface and/or limiting thermal insulators such as air from interfering with heat transfer).

The active heat transfer device 426 may actively transfer heat from the first surface 427 to a second surface of the active heat transfer device 426 based on electrical energy supplied to the active heat transfer device 426. The active heat transfer device 426 may include electrical contacts 470 (e.g., electrodes) that are used to couple the active heat transfer device 426 to an electrical energy source (e.g., a power source of the electronic device). The electrical energy may be supplied to the electrical contacts 470 by the electronic device 402, the heat source 410, and/or a dedicated electrical energy source. The second surface 428 may thermally interface with an interior surface 421 of the plate 420. The plate 420 may include the recessed portion 425 into which the active heat transfer device 426 may be at least partially embedded. The recessed portion 425 may include conformal recessed portions into which the electronic contacts may be at least partially embedded. The conformal recessed portions may include electrical connectors to facilitate electrical connections between the electrical contacts 470 and an electrical energy source in the electronic device 402.

A portion of the interior surface 421 may thermally interface with a second surface of the active heat transfer device 426. Heat may be conducted from the second surface to the recessed portion 425 of the interior surface 421 of the plate 420. In implementations in which there is no recessed portion 425, the second surface may transmit heat to any portion of the interior surface 421 of the plate 420. The heat transmitted to the interior surface 421 may then be conducted through the plate 420 to an exterior surface of the plate 420. The portion of the exterior surface that is on an opposite side of the portion of the interior surface 421 that thermally interfaces with the second side of the active heat transfer device 426 may receive most of the heat and be designated a hot spot. The hot spot may be covered by a mounting wall or mounting assembly element.

The heat conducted to the exterior surface is dissipated from the exterior surface. In some implementations, the exterior surface includes a first passive heat transfer element.

The plate 420 may be used to mount the electronic device 402 via mount couplers 430. The plate 420 may be coupled to the case 409 via plate couplers 432. The electronic device system 400 may also include an optional alternative plate 450 that does not include mounting elements. The optional alternative plate 450 may be selectively exchanged with the plate 420. A user may exchange the plate 420 with the optional alternative plate 450 when the electronic device 402 is not to be mounted. The optional alternative plate 450 may not include any active heat transfer device 426 and may be less able to distribute heat from a back surface of the electronic device 402. The optional alternative plate 450 may use some of the same plate couplers 432 (e.g., screws) as the plate 420 to couple to the case 409.

Figure 5:
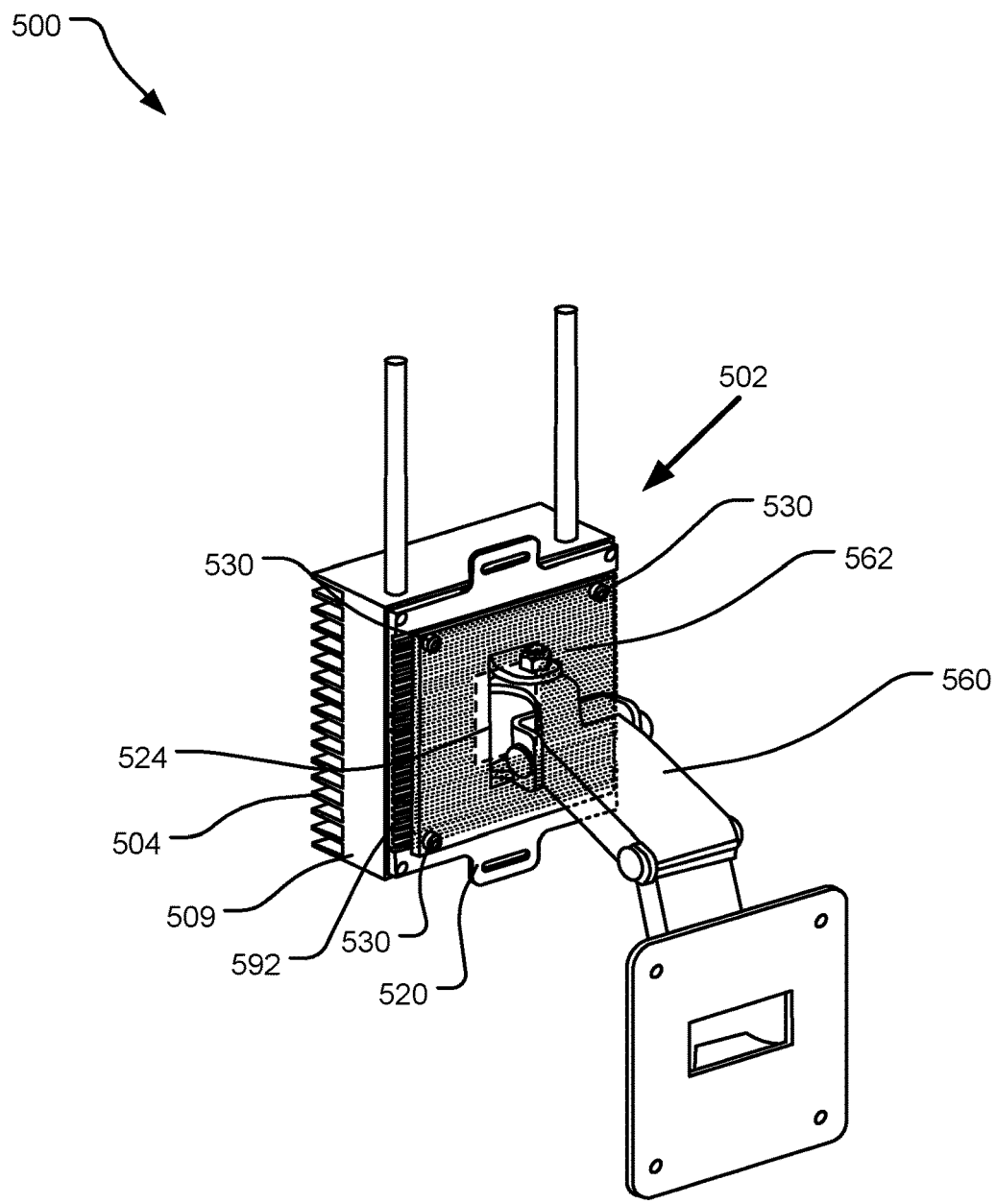
FIG. 5 illustrates an example electronic device system that is mounted by a mounting element.

FIG. 5 illustrates an example electronic device system 500 that is mounted by a mounting element. The electronic device 502 includes a case 509 with a second passive heat transfer element 504 on a front surface and a plate 520 that at least partially defines a back surface 592 of the electronic device 502 when coupled to the case 509. The case 509 is coupled to the plate 520 via plate couplers. The plate 520 may have a hot spot 524 that represents a portion of an exterior surface of the plate 520 that is on the opposite side of a portion of an interior surface of the plate 520 that thermally interfaces with a second ("hot") side of an active heat transfer device. The plate 520 includes mounting couplers 530 that couple the plate to a mounting surface 562 of a mounting element 560. In the illustrated implementation, the mounting element is an articulating mounting arm. Alternative implementations are contemplated in which the electronic device 502 is mounted on a wall (which may effectively serve as a mounting surface 562) or a fixed mounting arm. In the illustrated implementation, the mounting surface 562 covers the hot spot 524. By covering the hot spot 524, which is potentially the hottest part of the device because of the active heat transfer, the rest of the surfaces may be maintained at higher temperatures that would otherwise be limited by the hot spot 524 exceeding a surface temperature safety limit (or otherwise fail or satisfy a thermal control condition). This may allow the electronic device 502 to use more resources and operate at higher internal temperatures.

Figure 6:
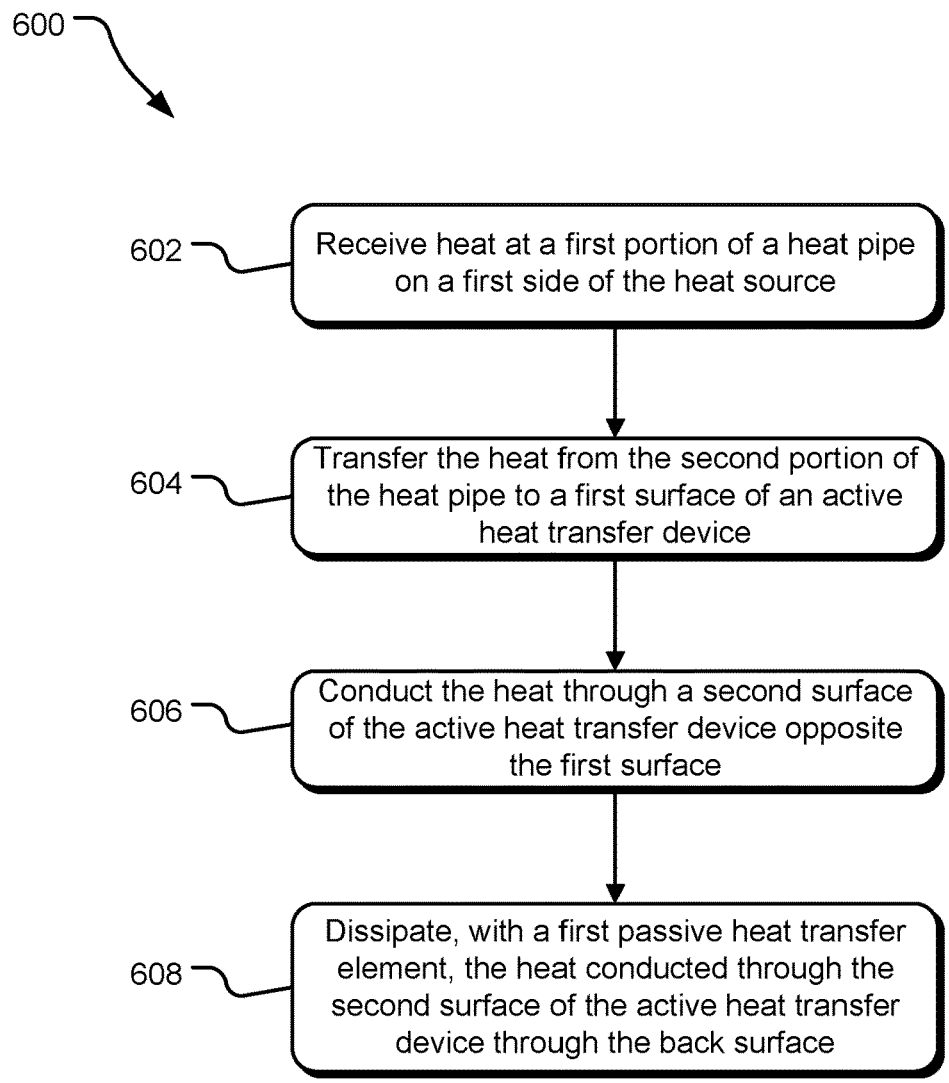
FIG. 6 illustrates example operations for transferring heat away from a front surface of an electronic device and dissipating the heat through a back surface of the electronic device opposite the front surface.

FIG. 6 illustrates example operations 600 for transferring heat away from a front surface of an electronic device and dissipating the heat through a back surface of the electronic device opposite the front surface using a cooling system of the electronic device. The cooling system may include a heat transfer channel (e.g., a heat pipe) that wraps around the heat source and includes a first portion on the first side of the heat source and a second portion on the second opposite side of the heat source. The cooling system may further include an active heat transfer device positioned adjacent to the second portion of the heat pipe. The active heat transfer device may be adapted to absorb heat through a first surface facing the heat pipe and release the heat through a second opposite surface using the cooling system. The cooling system may still further include a first (back side) passive heat transfer element that conducts heat received from the second opposite surface of the active heat transfer device out through the back surface of the electronic device.

A receiving operation 602 receives heat generated by a heat source at a first portion of a heat pipe on a first side of the heat source. In one implementation, the heat pipe wraps partially around the heat source and includes a second portion on the second (e.g., opposite) side of the heat source. The heat transfer channel may wrap around at least a portion of each of three sides (e.g., including an edge) of the heat source.

The electronic device includes a heat source, such as a printed circuit board (PCB) that includes a processing system. The heat source thermally interfaces with a heat pipe at a first portion of the heat pipe positioned on the first side of the heat source. Heat is introduced to the heat pipe from the heat source. Some of that heat is conducted to a front surface of the electronic device. In one implementation, the front surface includes a second passive heat transfer element that facilitates heat transfer along the front surface and heat dissipation generally in a direction orthogonal to the front surface by the second passive heat transfer element. For example, the heat pipe wraps around the heat source (e.g., around an edge of the heat source) from the first side to the second side, receives heat at the first portion from the heat source on the first side, and transfers the heat around the heat source to a second portion of the heat pipe. In one implementation, the heat pipe includes a volatile fluid on its interior that vaporizes at the first portion and condenses at the second portion.

The fluid may include materials (e.g., included in or related to a thermal control condition) that are formulated to vaporize within a predefined hot temperature range and condense within a predefined cold temperature range. The hot temperature range and the cold temperature range may be based on one or more of the composition of the fluid used, a predefined range of internal temperatures in the electronic device (e.g., temperatures of the heat source) during operation, a predefined range of ambient temperatures, a predefined range of differences between the temperatures of an ambient environment and an internal temperature of the electronic device (e.g., the internal a temperature of the heat source), predefined temperature ranges relative to a temperature of or outside of the electronic device, and predefined vapor pressure ranges of the volatile fluid.

A heat transfer operation 604 transfers the heat from the second portion of the heat pipe to a first surface of an active heat transfer device. The second portion thermally interfaces with a first ("cold") surface of an active heat transfer device. The heat that is transferred around the heat source to the second portion is conducted from the second portion to the first surface of the active heat transfer device. The active heat transfer device receives electrical energy and, based on the received electrical energy, actively transfers heat from the first surface to a second surface of the active heat transfer device.

The active heat transfer device is a heat transfer device that receives electrical energy to facilitate active heat exchange from the first surface to a second surface. In the illustrated implementation, the active heat transfer device is a TEC. Alternative active heat transfer devices include shell and tube heat exchangers, plate heat exchangers, plate-fin heat exchangers, finned tube heat exchangers, pillow plate heat exchangers, dynamic scraped surface heat exchangers, phase change heat exchangers, adiabatic wheel heat exchangers, direct contact heat exchangers, multi-pass heat exchangers, and condensers.

In one implementation, the electrical energy supplied to the active heat transfer device is controlled by a computing system including a processing system and memory configured to modify the quantity of heat exchanged by the active heat transfer by modifying electrical energy (e.g., current and/or voltage) supplied to the active heat transfer device.

In one implementation, the computing system modifies in a modifying operation the electrical energy supplied to the active heat transfer device responsive to determining that a thermal control condition has been satisfied. The thermal control condition may be as described with respect to other figures herein.

In one implementation, the heat transfer and/or heat distribution is imbalanced with respect to the first side and the second side of the heat source due to the fact that the heat source generates more heat on the first side than the second side and/or due to the fact that the electronic device transfers more of the heat generated by the heat source on the first side to the second side than is dissipated on the first side (e.g., via the first passive heat transfer element). The above-described attributes of the active heat transfer device may cause a sufficient difference in temperature between the first surface and the second surface such that the active heat transfer device creates a larger temperature gradient between the heat source and the first surface of the active heat transfer device than remains between the heat source and the front surface (e.g., via the second passive heat transfer element). The above-described active transfer of heat to the second side of the heat source may also better distribute heat within the electronic device by distributing more heat to the second side than would have been distributed there passively without a heat pipe. In some implementations, the first and second passive heat transfer elements are different sizes, further contributing to an imbalanced heat transfer such that a greater amount of heat is dissipated out the back side of the device.

In one implementation, the electronic device is to be mounted using a plate on the back side of the electronic device by coupling in a coupling operation the plate to a mounting element. The transfer of heat from the first side to the second side directs heat to an area (e.g., a hot spot) on an exterior surface of the plate opposite a portion of an interior surface of the plate with which the second opposite portion of the active heat transfer device thermally interfaces covered by the mounting, allowing for higher operating temperatures and performance because the exposed surfaces (e.g., the front surface) maintain lower temperatures during operation and do not violate exposed surface temperature safety limits. Further, dissipating a greater amount of heat from more surfaces and using active heat transfer reduces the temperature of any given portion of the interior of the electronic device, allowing the heat source and/or its components (e.g., the processing system) to use more resources that generate more heat. Also, by having a hot spot that is covered by a mounting, the tolerance for high operating temperatures of the heat source may be greatly increased if most of the heat in the electronic device is actively transferred to the hot spot that is covered. The plate may include a first passive heat transfer element. In an implementation, the plate may be coupled in a coupling operation to a mount.

A conducting operation 606 conducts heat through a second surface of the active heat transfer device opposite the first surface. The heat is conducted from the second surface to an interior surface of a plate that, when coupled to a case of the electronic device, defines at least a portion of a back surface of the electronic device.

In one implementation, the plate has a recess in the interior surface and the active heat transfer device is at least partially arranged (e.g., embedded) in the recess. These features may reduce the overall thickness of the device and improve the conduction of heat from the second surface to the interior surface of the plate. In implementations where the active heat transfer device is a TEC, the second surface may be a "hot surface" to which heat is actively transferred from the first surface which may be a "cold surface."

The plate further includes an exterior surface that dissipates a majority of the heat generated by the heat source. For example, a portion of the exterior surface of the plate thermally interfaces with the second surface of the active heat transfer device and receives more heat than other portions of the exterior surface of the plate such that the exterior surface portion serves as a "hot spot." The hot spot can be optionally covered, such as by mounting to a wall or mounting element surface, thereby allowing the hot spot to safely reach higher temperatures than in implementations where the hot spot is exposed (e.g., because a surface temperature safety threshold would be exceeded at the otherwise exposed hot spot 324).

A dissipating operation 608 dissipates, with a first passive heat transfer element, the heat conducted through the second surface of the active heat transfer device through the back surface of the electronic device. In one implementation, the first passive heat transfer element is included on the exterior surface of the plate, and the heat is at least partially dissipated from the first passive heat transfer element.

In an implementation, further heat generated by the heat source is dissipated by another dissipating operation through a second passive heat transfer element on a front surface of the electronic device adjacent to the first side of the heat source.

Figure 7:
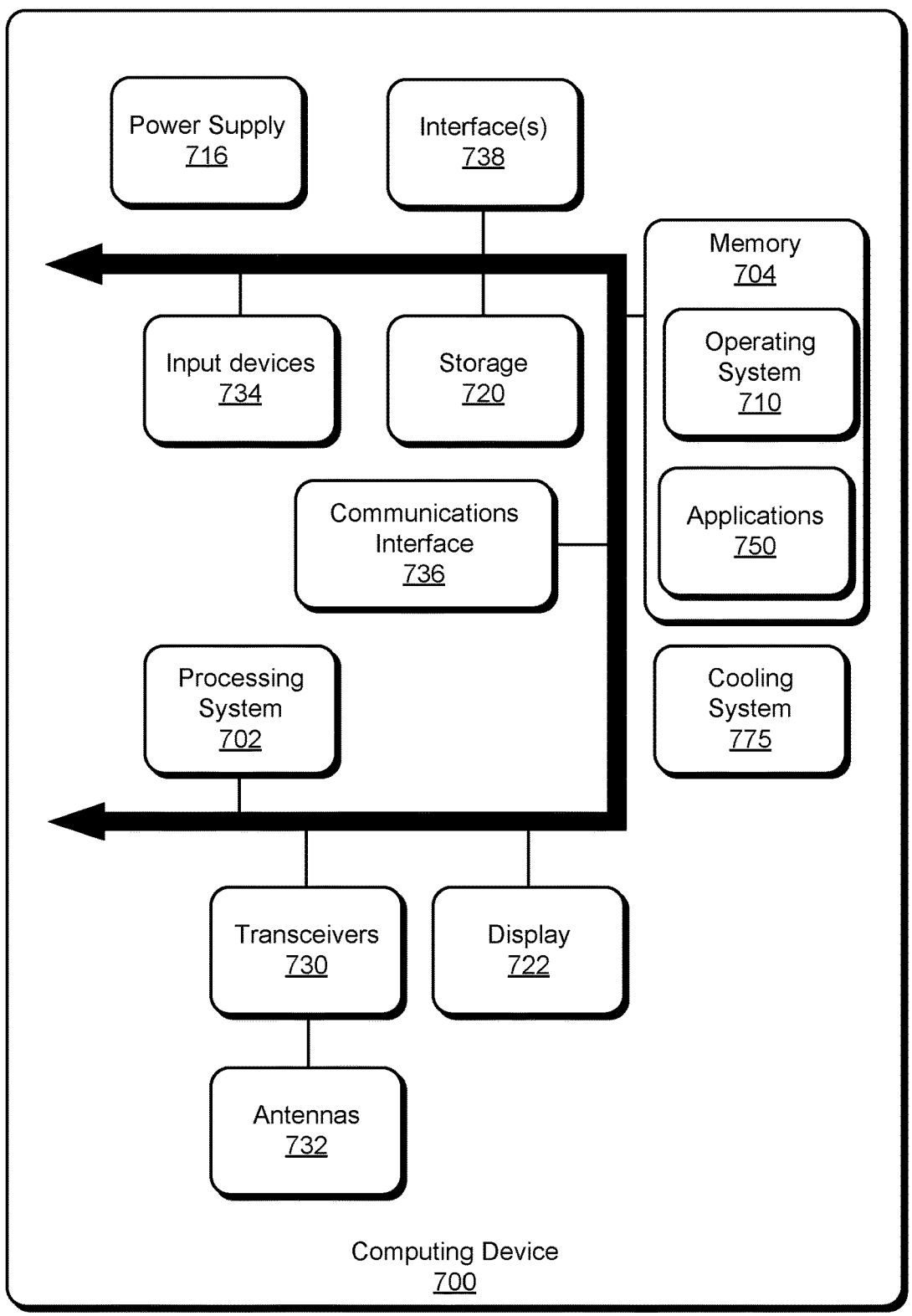
FIG. 7 illustrates an example computing system.

FIG. 7 illustrates an example computing system 700 for implementing the features and operations of the described technology. The computing system 700 may embody a remote-control device or a physical controlled device and is an example network-connected and/or network-capable device and may be a client device, such as a laptop, mobile device, desktop, tablet; a server/cloud device; an internet-of-things device; an electronic accessory; or another electronic device. The computing system 700 includes a processing system 702 and a memory 704. The processing system 702 may be an implementation of one or more of processing systems 312 and 412. The memory 704 generally includes both volatile memory (e.g., RAM) and nonvolatile memory (e.g., flash memory). An operating system 710 resides in the memory 704 and is executed by the processing system 702. In implementations, the heat source (e.g., 210, 310, 410) of the electronic device system may be in the form of or may include the computing system 700.

In an example computing system 700, as illustrated in FIG. 7, one or more modules or segments, such as applications 750 and a thermal control module are loaded into the operating system 710 on the memory 704 and/or storage 720 and executed by the processing system(s) 702. The storage 720 may include one or more tangible storage media devices and may store thermal control conditions, measured temperatures, other thermal control condition parameters, locally and globally unique identifiers, requests, responses, and other data and be local to the computing system 700 or may be remote and communicatively connected to the computing system 700.

The computing system 700 includes a power supply 716, which is powered by one or more batteries or other power sources and which provides power to other components of the computing system 700. The power supply 716 may also be connected to an external power source that overrides or recharges the built-in batteries or other power sources. In implementations, the power supply 716 may supply electrical energy to an active heat transfer device.

The computing system 700 may include one or more communication transceivers 730, which may be connected to one or more antenna(s) 732 to provide network connectivity (e.g., mobile phone network, Wi-Fi®, Bluetooth®) to one or more other servers and/or client devices (e.g., mobile devices, desktop computers, or laptop computers). The computing system 700 may further include a communications interface 736 (e.g., a network adapter), which is a type of computing system. The computing system 700 may use the communications interface 736 and any other types of computing systems for establishing connections over a wide-area network (WAN) or local-area network (LAN). It should be appreciated that the network connections shown are examples and that other computing systems and means for establishing a communications link between the computing system 700 and other devices may be used.

The computing system 700 may include one or more input devices 734 such that a user may enter commands and information (e.g., a keyboard or mouse). These and other input devices may be coupled to the server by one or more interfaces 738, such as a serial port interface, parallel port, or universal serial bus (USB). The computing system 700 may further include a display 722, such as a touch screen display.

The computing system 700 may include a variety of tangible processor-readable storage media and intangible processor-readable communication signals. Tangible processor-readable storage can be embodied by any available media that can be accessed by the computing system 700 and includes both volatile and nonvolatile storage media, removable and non-removable storage media. Tangible processor-readable storage media excludes communications signals (e.g., signals per se) and includes volatile and nonvolatile, removable and non-removable storage media implemented in any method or technology for storage of information such as processor-readable instructions, data structures, program modules, or other data. Tangible processor-readable storage media includes RAM, ROM, EEPROM, flash memory or other memory technology, CDROM, digital versatile disks (DVD) or other optical disk storage, magnetic cassettes, magnetic tape, magnetic disk storage, or other magnetic storage devices, or any other tangible medium which can be used to store the desired information and which can be accessed by the computing system 700. In contrast to tangible processor-readable storage media, intangible processor-readable communication signals may embody processor-readable instructions, data structures, program modules, or other data resident in a modulated data signal, such as a carrier wave or other signal transport mechanism. The term "modulated data signal" means a signal that has one or more of its characteristics set or changed in such a manner as to encode information in the signal. By way of example, intangible communication signals include signals traveling through wired media such as a wired network or direct-wired connection, and wireless media such as acoustic, RF, infrared, and other wireless media.

The computing system 700 may include a cooling system 775 to cool components of the computing system 700. The cooling system 775 may include a heat pipe (e.g., an implementation of heat pipe 306 or 406) adapted to extend along three sides of a heat source (e.g., an implementation of heat source 310 or 410). The heat pipe may include a first portion adapted to be positioned on a first side of the heat source and a second portion adapted to be positioned on a second side of the heat source opposite the first side, the first portion of the heat pipe adapted to absorb heat from a first side of the heat source. The cooling system 775 may further include an active heat transfer device (e.g., an implementation of active heat transfer device 326 or 426) positioned adjacent to the second portion of the heat pipe. The active heat transfer device may be adapted to absorb the heat through a first surface facing the heat pipe and release the heat through a second surface opposite the first surface. The cooling system 775 may further include a first passive heat transfer element (e.g., an implementation of first passive heat transfer element 222 or 322) adjacent to the second surface of the active heat transfer device. In implementations, the active heat transfer device includes a thermoelectric cooler. In implementations, the cooling system 775 may include a second passive heat transfer element (e.g., an implementation of second passive heat transfer element 204, 304, 404, or 504). adjacent to the first side of the heat source. In an implementation, the second passive heat transfer element is larger than the first passive heat transfer element.

Various software components described herein are executable by one or more processors of a processing system, which may include logic machines configured to execute hardware or firmware instructions. For example, the processors may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

Aspects of processors and storage may be integrated together into one or more hardware logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of a remote-control device and/or a physically controlled device implemented to perform a particular function. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

It will be appreciated that a "service," as used herein, is an application program executable across one or multiple user sessions. A service may be available to one or more system components, programs, and/or other services. In some implementations, a service may run on one or more server computing systems.

The logical operations making up implementations of the technology described herein may be referred to variously as operations, steps, objects, or modules. Furthermore, it should be understood that logical operations may be performed in any order, adding or omitting operations as desired, regardless of whether operations are labeled or identified as optional, unless explicitly claimed otherwise or a specific order is inherently necessitated by the claim language.

An example electronic device is provided. The electronic device includes a printed circuit board (PCB) having a first side facing a front surface of the electronic device and a second side opposite the first side, the second side facing a back surface of the electronic device and a cooling system adapted to pull heat away from the first side of the PCB and dissipate the heat through the back surface of the electronic device. The cooling system includes a heat pipe that wraps around three sides of the PCB and includes a first portion on the first side of the PCB and a second portion on the second side of the PCB, an active heat transfer device positioned adjacent to the second portion of the heat pipe, the active heat transfer device having a first surface facing the heat pipe and a second surface opposite the first surface and facing the back surface of the electronic device, the active heat transfer device adapted to absorb the heat through the first surface and release the heat through the second surface, and a first passive heat transfer element that forms the back surface of the electronic device and that conducts the heat received from the second surface of the active heat transfer device out of the electronic device.

Another example electronic device of any preceding device is provided. The electronic device further includes a case at least partially enclosing the first side of the PCB and the heat pipe and a plate coupled to the case on the second side of the PCB, wherein the plate at least partially defines the back surface of the electronic device and wherein the first passive heat transfer element is at least partially embedded within or coupled to the plate.

Another example electronic device of any preceding device is provided, wherein the plate has an interior surface facing the PCB and an exterior surface substantially opposite the interior surface and a portion of the interior surface of the plate thermally interfaces with the second surface of the active heat transfer device.

Another example electronic device of any preceding device is provided, wherein the portion of the interior surface includes a recess and the active heat transfer device is arranged at least partially within the recess.

Another example electronic device of any preceding device is provided, wherein the plate includes mount coupling elements in the exterior surface of the plate and positioned about a back surface hot spot that is located on the exterior surface of the plate opposite the portion of the interior surface of the plate that thermally interfaces with the second surface of the active heat transfer device.

Another example electronic device of any preceding device is provided further including a mount coupled to the exterior surface of the plate covering the back surface hot spot.

Another example electronic device of any preceding device is provided, wherein the case includes a second passive heat transfer element on a front surface of the case that is adjacent to the first side of the PCB.

Another example electronic device of any preceding device is provided, wherein the first passive heat transfer element and the second passive heat transfer element are heat sinks Another example electronic device of any preceding device is provided, wherein the second passive heat transfer element is larger than the first passive heat transfer element.

Another example electronic device of any preceding device is provided further including a processor and memory, the processor operable to execute instructions stored on the memory to modify electrical energy supplied to the active heat transfer device responsive to satisfaction of a thermal control condition. The thermal control condition includes a temperature difference between a temperature of a first position in an interior of the electronic device and a temperature of a second position outside of the electronic device exceeding a first threshold value or an operating energy that includes energy used by the PCB exceeding a second threshold value.

Another example electronic device of any preceding device is provided, wherein the PCB is arranged such that more of the heat is generated on the first side than the second side during operation.

Another example electronic device of any preceding device is provided, wherein the active heat transfer device includes a thermoelectric cooler.

An example method of transferring heat away from a front surface of an electronic device and dissipating the heat through a back surface of the electronic device opposite the front surface is provided. The method includes receiving the heat generated by a heat source at a first portion of a heat pipe on a first side of the heat source, the heat pipe wrapping partially around the heat source and including a second portion on a second side of the heat source opposite the first side, transferring the heat from the second portion of the heat pipe to a first surface of an active heat transfer device, conducting the heat through a second surface of the active heat transfer device opposite the first surface, and dissipating, with a first passive heat transfer element, the heat conducted through the second surface of the active heat transfer device through the back surface of the electronic device.

Another example method of any preceding method is provided further including coupling a plate that includes the first passive heat transfer element to a mounting element, the mounting element covering a back surface hot spot on an exterior surface of the plate opposite a portion of an interior surface of the plate with which the second opposite surface of the active heat transfer device thermally interfaces.

Another example method of any preceding method is provided further including modifying, by a processor, energy supplied to the active heat transfer device responsive to satisfaction of a thermal control condition. The thermal control condition includes a temperature difference between a temperature of a first position in an interior of the electronic device and a temperature of a second position outside of the electronic device exceeding a first threshold value or an operating energy that includes energy used by the heat source exceeding a second threshold value.

Another example method of any preceding method is provided further including dissipating, with a second passive heat transfer element adjacent to the first side of the heat source, further heat generated by the heat source through a front surface of the electronic device.

An example cooling system is provided. The cooling system includes a heat pipe adapted to extend along three sides of a heat source, the heat pipe including a first portion adapted to be positioned on a first side of the heat source and a second portion adapted to be positioned on a second side of the heat source opposite the first side, the first portion of the heat pipe adapted to absorb heat from the first side of the heat source, an active heat transfer device positioned adjacent to the second portion of the heat pipe, the active heat transfer device adapted to absorb the heat through a first surface facing the heat pipe and release the heat through a second surface opposite the first surface, and a first passive heat transfer element adjacent to the second surface of the active heat transfer device.

Another example cooling system of any preceding system is provided, wherein the active heat transfer device includes a thermoelectric cooler.

Another example cooling system of any preceding system is provided further including a second passive heat transfer element adjacent to the first side of the heat source.

Another example cooling system of any preceding system is provided, wherein the second passive heat transfer element is larger than the first passive heat transfer element.

An example system for transferring heat away from a front surface of an electronic device and dissipating the heat through a back surface of the electronic device opposite the front surface is provided. The system includes means for receiving the heat generated by a heat source at a first portion of a heat pipe on a first side of the heat source, the heat pipe wrapping partially around the heat source and including a second portion on a second side of the heat source opposite the first side, means for transferring the heat from the second portion of the heat pipe to a first surface of an active heat transfer device, means for conducting the heat through a second surface of the active heat transfer device opposite the first surface, and means for passively dissipating the heat conducted through the second surface of the active heat transfer device through the back surface of the electronic device.

Another example system of any preceding system is provided further including means for coupling a plate that includes the first passive heat transfer element to a mounting element, the mounting element covering a back surface hot spot on an exterior surface of the plate opposite a portion of an interior surface of the plate with which the second opposite surface of the active heat transfer device thermally interfaces.

Another example system of any preceding system is provided further including means for modifying energy supplied to the active heat transfer device responsive to satisfaction of a thermal control condition. The thermal control condition includes a temperature difference between a temperature of a first position in an interior of the electronic device and a temperature of a second position outside of the electronic device exceeding a first threshold value or an operating energy that includes energy used by the heat source exceeding a second threshold value.

Another example method of any preceding method is provided further including means for passively dissipating further heat generated by the heat source through a front surface of the electronic device.

While this specification contains many specific implementation details, these should not be construed as limitations on the scope of any technologies or of what may be claimed, but rather as descriptions of features specific to particular implementations of the particular described technology. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

A number of implementations of the described technology have been described. Nevertheless, it will be understood that various modifications can be made without departing from the spirit and scope of the recited claims.

What is claimed is:

1. An electronic device, comprising:
    a printed circuit board (PCB) having a first side facing a front surface of the electronic device and a second side opposite the first side, the second side facing a back surface of the electronic device;
    a cooling system adapted to pull heat away from the first side of the PCB and dissipate the heat through the back surface of the electronic device, the cooling system including:

a heat pipe that wraps around three sides of the PCB and includes a first portion on the first side of the PCB and a second portion on the second side of the PCB;
an active heat transfer device positioned adjacent to the second portion of the heat pipe, the active heat transfer device having a first surface facing the heat pipe and a second surface opposite the first surface and facing the back surface of the electronic device, the active heat transfer device being adapted to absorb the heat through the first surface and release the heat through the second surface;
a first passive heat transfer element that forms the back surface of the electronic device and that conducts the heat received from the second surface of the active heat transfer device out of the electronic device; and
a plate on the second side of the PCB, wherein the plate at least partially defines the back surface of the electronic device and wherein the first passive heat transfer element is at least partially embedded within or coupled to the plate.

2. The electronic device of claim 1, further comprising:
a case at least partially enclosing the first side of the PCB and the heat pipe, wherein the plate is coupled to the case.

3. The electronic device of claim 2, wherein:
the plate has an interior surface facing the PCB and an exterior surface substantially opposite the interior surface, and
a portion of the interior surface of the plate thermally interfaces with the second surface of the active heat transfer device.

4. The electronic device of claim 3, wherein the portion of the interior surface includes a recess and the active heat transfer device is arranged at least partially within the recess.

5. The electronic device of claim 3, wherein the plate includes mount coupling elements in the exterior surface of the plate and positioned about a back surface hot spot that is located on the exterior surface of the plate opposite the portion of the interior surface of the plate that thermally interfaces with the second surface of the active heat transfer device.

6. The electronic device of claim 5, further comprising:
a mount coupled to the exterior surface of the plate covering the back surface hot spot.

7. The electronic device of claim 2, wherein the case includes a second passive heat transfer element on a front surface of the case that is adjacent to the first side of the PCB.

8. The electronic device of claim 7, wherein the first passive heat transfer element and the second passive heat transfer element are heat sinks.

9. The electronic device of claim 7, wherein the second passive heat transfer element is larger than the first passive heat transfer element.

10. The electronic device of claim 1, further comprising a processor and memory, the processor operable to execute instructions stored on the memory to modify electrical energy supplied to the active heat transfer device responsive to satisfaction of a thermal control condition, the thermal control condition including:
a temperature difference between a temperature of a first position in an interior of the electronic device and a temperature of a second position outside of the electronic device exceeding a first threshold value; or
an operating energy that includes energy used by the PCB exceeding a second threshold value.

11. The electronic device of claim 1, wherein the PCB is arranged such that more of the heat is generated on the first side than the second side during operation.

12. The electronic device of claim 1, wherein the active heat transfer device includes a thermoelectric cooler.

13. A method of transferring heat away from a front surface of an electronic device and dissipating the heat through a back surface of the electronic device opposite the front surface, the method comprising:
receiving the heat generated by a heat source at a first portion of a heat pipe on a first side of the heat source, the heat pipe wrapping partially around the heat source and including a second portion on a second side of the heat source opposite the first side;
transferring the heat from the second portion of the heat pipe to a first surface of an active heat transfer device;
conducting the heat through a second surface of the active heat transfer device opposite the first surface; and
dissipating, with a first passive heat transfer element coupled to or embedded within a plate that at least partially defines a back surface of the electronic device, the heat conducted through the second surface of the active heat transfer device through the back surface of the electronic device.

14. The method of claim 13, further comprising:
coupling a plate that includes the first passive heat transfer element to a mounting element, the mounting element covering a back surface hot spot on an exterior surface of the plate opposite a portion of an interior surface of the plate with which the second opposite surface of the active heat transfer device thermally interfaces.

15. The method of claim 13, further comprising:
modifying, by a processor, energy supplied to the active heat transfer device responsive to satisfaction of a thermal control condition, the thermal control condition including:
a temperature difference between a temperature of a first position in an interior of the electronic device and a temperature of a second position outside of the electronic device exceeding a first threshold value; or
an operating energy that includes energy used by the heat source exceeding a second threshold value.

16. The method of claim 13, further comprising:
dissipating, with a second passive heat transfer element adjacent to the first side of the heat source, further heat generated by the heat source through a front surface of the electronic device.

17. A cooling system, comprising:
a heat pipe adapted to extend along three sides of a heat source, the heat pipe including a first portion positioned on a first side of the heat source and a second portion adapted to be positioned on a second side of the heat source opposite the first side, the first portion of the heat pipe adapted to absorb heat from the first side of the heat source;
an active heat transfer device positioned adjacent to the second portion of the heat pipe, the active heat transfer device being adapted to absorb the heat through a first surface facing the heat pipe and release the heat through a second surface opposite the first surface; and
a first passive heat transfer element adjacent to the second surface of the active heat transfer device, the first passive heat element being coupled to or embedded within a plate that dissipates the heat and that at least partially defines a back surface of an electronic device.

18. The cooling system of claim 17, wherein the active heat transfer device includes a thermoelectric cooler.

19. The cooling system of claim 17, further comprising:
a second passive heat transfer element adjacent to the first side of the heat source.

20. The cooling system of claim 19, wherein the second passive heat transfer element is larger than the first passive heat transfer element.

* * * * *